US010871663B2

(12) United States Patent
Le Maitre et al.

(10) Patent No.: US 10,871,663 B2
(45) Date of Patent: Dec. 22, 2020

(54) INTEGRATED ELECTRO-OPTICAL DEVICE

(71) Applicants: STMicroelectronics (Crolles 2) SAS, Crolles (FR); Commissariat a l'Energie Atomique et aux Energies Alternatives, Paris (FR)

(72) Inventors: Patrick Le Maitre, Biviers (FR); Nicolas Michit, Grenoble (FR); Jean-Francois Carpentier, Grenoble (FR); Benoit Charbonnier, Lyons (FR)

(73) Assignees: STMICROELECTRONICS (CROLLES 2) SAS, Crolles (FR); COMMISSARIAT A L'ENERGIE ATOMIQUE ETAUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/401,956

(22) Filed: May 2, 2019

(65) Prior Publication Data
US 2019/0339551 A1  Nov. 7, 2019

(30) Foreign Application Priority Data

May 3, 2018 (FR) ...................................... 1853819

(51) Int. Cl.
*G02F 1/025* (2006.01)
*G01R 19/30* (2006.01)
*H01L 31/105* (2006.01)
*G02B 6/12* (2006.01)

(52) U.S. Cl.
CPC ............. *G02F 1/025* (2013.01); *G01R 19/30* (2013.01); *G02F 2203/21* (2013.01)

(58) Field of Classification Search
CPC ...... G02F 1/025; G02F 1/0147; G02F 1/3133; G01R 19/30; G02B 6/12004
See application file for complete search history.

(56) References Cited

U.S. PATENT DOCUMENTS 9,134,169 B2 * 9/2015 Li ......................... G01J 1/0209
2011/0142391 A1 6/2011 Asghari et al.
2016/0356959 A1 12/2016 Jayatilleka et al.

OTHER PUBLICATIONS

Agarwal, Saurabh et al., "Wavelength Locking Of A Si Ring Modulator Using An Integrated Drop-Port OMA Monitoring Circuit," 2015 IEEE Asian Solid-State Circuits Conference, Nov. 9-11, 2015, Xiamen, Fujian, China, 4 pages.
Hui, Yu et al., "Using Carrier-Depletion Silicon Modulators for Optical Power Monitoring," Optics Letters, vol. 37, No. 22, Nov. 15, 2012, 3 pages.
Li, Yu et al., "Active Resonance Wavelength Stabilization for Silicon Microring Resonators Using Slope-Detection With fn In-Resonator Defect-State-Absorption-Based Photodetector," 2015 Conference on Lasers and Electro-Optics (CLEO), Optical Society of America, May 10, 2015, 2 pages.
Zhang, Yu et al., "Towards Adaptively Tuned Silicon Microring Resonators for Optical Networks-on-Chip Applications," IEEE Journal of Selected Topics in Quantum Electronics, vol. 20, No. 4, Jul./Aug. 2014, 14 pages.

* cited by examiner

*Primary Examiner* — Ryan A Lepisto
(74) *Attorney, Agent, or Firm* — Slater Matsil, LLP

(57) ABSTRACT

A device, includes: a ring waveguide; a diode comprising a junction extending at least partly in the ring waveguide; and a first circuit configured to supply a signal representative of a leakage current in the diode.

20 Claims, 2 Drawing Sheets

INTEGRATED ELECTRO-OPTICAL DEVICE

CROSS-REFERENCE TO RELATED APPLICATIONS

This application claims priority to French Patent Application No. 1853819, filed on May 3, 2018, which application is hereby incorporated herein by reference.

TECHNICAL FIELD

The present disclosure generally concerns integrated devices, and more particularly electro-optical devices.

BACKGROUND

In an integrated photonic circuit, electro-optical devices including resonant ring waveguides, also called resonant rings, are currently used to transmit data via a light signal. Such resonant ring devices are for example electro-optical switches or electro-optical modulators.

SUMMARY

It would be desirable to have a resonant ring device which enables to measure the resonance wavelength of the ring.

It would further be desirable to have such a device which enables to determine a difference between the measured resonance wavelength and a targeted value.

It would also be desirable to have such a device which enables to correct the resonance wavelength of the ring based on such a difference.

Thus, an embodiment provides a device including: a ring waveguide; a diode; and a first circuit configured to supply a signal representative of a leakage current in the reverse-biased diode.

According to an embodiment, the junction of the diode and the waveguide are concentric.

According to an embodiment, the diode is a PN-type diode.

According to an embodiment, the diode is a PiN-type diode having its junction corresponding to the intrinsic region of the diode.

According to an embodiment, the junction of the diode is arranged in the waveguide.

According to an embodiment, the device further includes a second circuit configured to determine the resonance wavelength of the waveguide based on the signal representative of the leakage current.

According to an embodiment, the second circuit is configured to track a wavelength for which the leakage current is maximum.

According to an embodiment, the device further includes a heating element configured to modify the temperature of the waveguide.

According to an embodiment, the heating element is controlled according to the signal representative of the leakage current.

According to an embodiment, the device includes at least another waveguide optically coupled to the ring waveguide.

Another embodiment provides a method of correcting the resonance wavelength of a device such as defined hereabove.

According to an embodiment, the method includes the steps of: reverse-biasing the diode; measuring, for a plurality of wavelengths of an optical signal propagating through the ring waveguide, the leakage current in the reverse-biased diode.

According to an embodiment, the method further includes the step of determining a first value of the resonance wavelength by locating the maximum value of the leakage current.

According to an embodiment, the method further includes a step of determining, for the reverse biasing of the diode, a difference between the first value of the resonance wavelength and a second targeted value of the resonance wavelength.

According to an embodiment, the method further includes a step of heating the ring waveguide to a temperature determined by the difference.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION OF ILLUSTRATIVE EMBODIMENTS

Figure 1:
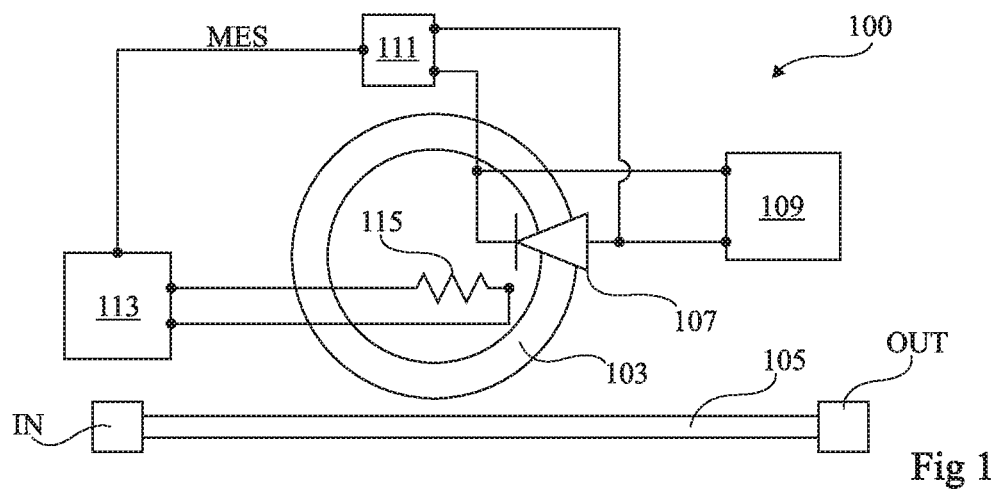
FIG. 1 is a top view very schematically illustrating an embodiment of an integrated electro-optical device with resonant ring.

The same elements have been designated with the same reference numerals in the various drawings and, further, the various drawings are not to scale. For clarity, only those steps and elements which are useful to the understanding of the described embodiments have been shown and are detailed. In particular, the various usual integrated electro-optical devices where a resonant ring is implemented have not been detailed, the described embodiments being compatible with such usual devices. Further, the forming of a resonant ring has not been detailed, it being within the abilities of those skilled in the art to determine the dimensions and the materials of a resonant ring according to a targeted resonance wavelength.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the drawings. Unless otherwise specified, the terms "approximately", "substantially", "about", and "in the order of" are used herein to designate a tolerance of plus or minus 10%, preferably of plus or minus 5%, of the value in question.

Unless otherwise specified, when reference is made to two elements electrically connected together, this means that the elements are directly connected with no intermediate element other than conductors, and when reference is made to two elements electrically coupled together, this means that the two elements may be directly coupled (connected) or coupled via one or a plurality of other elements.

FIG. 1 is a top view very schematically showing an embodiment of an integrated electro-optical modulator 100 with a resonant ring.

Modulator 100 includes a ring waveguide 103 and a waveguide 105, for example, rectilinear. Waveguide 103 forms the resonant ring of the modulator. Waveguide 105 couples an input IN to an output OUT of modulator 100. A portion of waveguide 105 is sufficiently close to, for example, in contact with, a portion of waveguide 103 so that an optical coupling can be established between these portions.

Modulator 100 further includes a diode 107. Diode 107 may be of PN type. Diode 107 may also be of PiN type and includes a non-doped semiconductor or intrinsic region interposed between two doped regions of opposite types, the diode junction then corresponding to the intrinsic semiconductor region. The junction of diode 107 extends at least partly in waveguide 103. Preferably, the junction of diode 107 and ring waveguide 103 are concentric, that is, the junction of diode 107 extends longitudinally parallel to the inner and outer cylindrical surfaces of ring waveguide 103. A circuit 109 for biasing diode 107 is configured to apply a bias voltage to diode 107. Two output terminals of circuit 109 are for example electrically coupled, preferably electrically connected, across diode 107.

Modulator 100 includes a heating element 115 configured to heat all or part of waveguide 103 to a temperature determined by the value of a control signal. As an example, heating element 115 is a resistor, for example, a metal strip, for example, arranged above and opposite a portion of waveguide 103.

A control circuit 113 having two output terminals for example respectively electrically coupled, preferably electrically connected, to the two terminals of heating element 115, is configured to supply the heating element control signal.

Modulator 100 further includes a measurement circuit 111 configured to supply a signal MES representative of a leakage current in diode 107 when the latter is reverse biased. Two input terminals of circuit 111 are for example respectively coupled, preferably electrically connected, across diode 107. Signal MES is available at an output terminal of circuit in, this output terminal being for example electrically coupled, preferably electrically connected, to an input terminal of control circuit 113 which receives signal MES.

Figure 2:
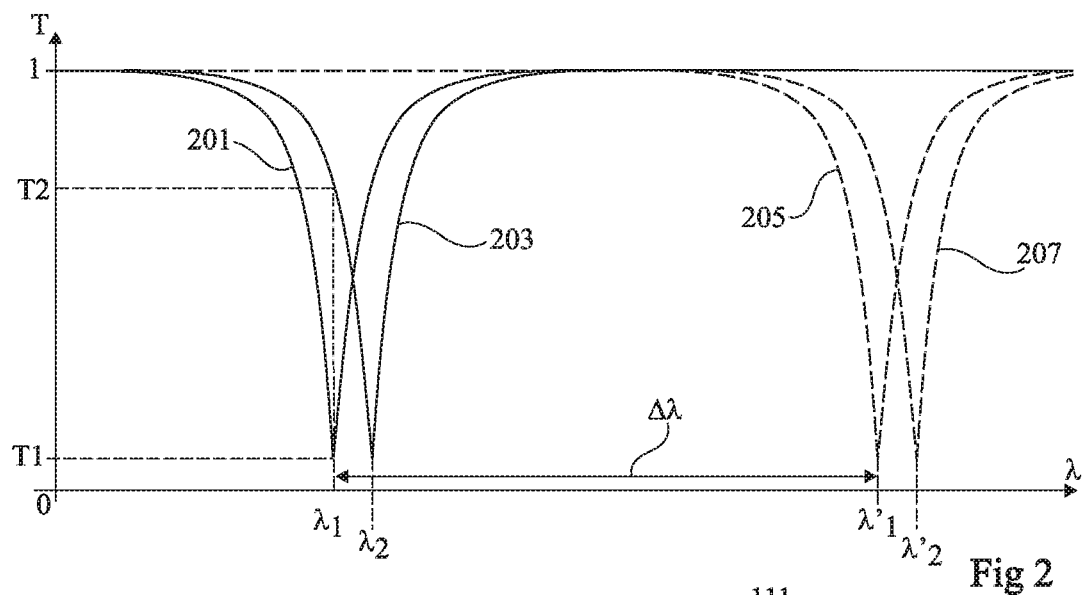
FIG. 2 illustrates, according to the wavelength, the variation of coefficient T of transmission of the optical power between an input and an output of the device of FIG. 1.

FIG. 2 illustrates the variation of transmission coefficient T (in ordinates) between input IN and output OUT of modulator 100, of the optical power of a light signal supplied at input IN, according to wavelength λ (in abscissa) of the signal.

Theoretical curves 201 and 203 illustrate the expected operation of modulator 100.

When diode 107 is not biased (curve 201), resonant ring 103 has a resonance wavelength of targeted value λ1. For the wavelength of value λ1, the optical coupling between waveguides 103 and 105 is significant and the signal supplied to input IN essentially flows through ring waveguide 103 where it remains confined. As a result, at this wavelength of value λ1, the optical power transmitted from input IN to output OUT of modulator 100 is relatively low, as shown by coefficient T1.

When diode 107 is biased (curve 203), reverse-biased if it is of PN type and forward-biased if it is of PiN type, the resonance wavelength of waveguide 103 has a targeted value λ2 depending on the value of the bias voltage. At the wavelength of value λ1, the optical coupling between waveguides 103 and 105 is lighter than when diode 107 is not biased, and the signal supplied to input IN is essentially propagated to output OUT of modulator 100. As a result, at this wavelength of value λ1, the optical power transmitted from input IN to output OUT of modulator 100 is greater than when diode 107 is not biased, as shown by coefficient T2, greater than coefficient T1.

Thus, by modifying the biasing of diode 107 of modulator 100, the power of the optical signal available at output OUT of modulator 100 is modulated at the wavelength of value λ1.

Curves 205 and 207 illustrate the real operation of device 100.

When diode 107 is not biased (curve 205), the resonance wavelength of ring 103 has a value λ1' equal to λ1+Δλ. When diode 107 is biased in the same way as for curve 203 (curve 207), the resonance wavelength of ring 103 has a value λ2' equal to λ2+Δλ.

It can be observed that, whatever the biasing of diode 107, the resonance wavelength of ring 103 is offset by a quantity Δλ with respect to a targeted value. Offset Δλ is for example due to manufacturing variations and/or to temperature variations in ring waveguide 103. Due to offset Δλ, modulator wo does not have the expected operation.

In the embodiment of FIG. 1, control circuit 113 is configured to determine the resonance wavelength of ring 103 from signal MES. More particularly, circuit 113 is configured to locate the maximum value of the leakage current in diode 107 from signal MES and deduce therefrom the value of the resonance wavelength of ring 103, that is, the value of the wavelength corresponding to the located maximum value of the leakage current. Indeed, the inventors have observed that the leakage current in reverse-biased diode 107 is maximum when a signal at the resonance wavelength of ring 103 propagates therein.

Thus, during a phase of measurement of the resonance wavelength of ring 103, diode 107 is reverse-biased with a bias voltage of given value. To achieve this, bias circuit 109 supplies the anode of diode 107 with a potential lower than that of the cathode of the diode. An optical signal, the wavelength of which is varied, is supplied to input IN of modulator 100. Signal MES takes a plurality of values, each of which is representative of the leakage current in diode 107 for a wavelength of the signal supplied to input IN. Circuit 113 locates, from signal MES, the maximum value of the leakage current in diode 107, and then determines the value of the resonance wavelength of ring 103.

More particularly, in an example, the signal supplied to input IN of the modulator is provided by a tunable laser not shown in FIG. 1. The tunable laser provides, to the circuit 113, a signal representative of the value of its wavelength, or, said otherwise, of the wavelength value of the optical signal the laser transmits to the modulator 100. Thus, when the circuit 113 locates, from the MES signal, the maximum value of the leakage current in the diode 107, the circuit 113 knows, from the signal representative of the laser's wavelength value, the value of the wavelength of the optical signal propagated in the modulator when the current is maximum, this value of wavelength being equal to the value of the resonance wavelength of the ring.

When a correction phase is implemented, circuit 113 is also configured to determine, or calculate, difference Δλ between the measured, or determined, value of the resonance wavelength and a corresponding targeted value. This targeted value is for example stored in a memory (not shown in FIG. 1) of the circuit 113, and/or provided to the circuit 113, for example by a corresponding signal. Control circuit 113 is further configured to determine, based on difference Δλ, or, in other words, based on the measured resonance wavelength, the value of the signal controlling heating element 115. Indeed, a modification of the temperature in waveguide 103 causes a corresponding modification of its optical properties, and thus of its resonance wavelength. Thus, the value of the control signal is determined so that, after modification of the temperature of waveguide 103 by heating element 115, the resonance wavelength of ring 103 has the targeted value. In FIG. 2, this amounts to bringing curves 205 and 207 respectively onto curves 201 and 203. For example, the control circuit 113 stores in a memory a correspondence table which indicates, for each value of the difference Δλ, the corresponding value of the control signal.

Advantage is here taken from the fact that the measurement of the resonance wavelength of the ring is performed by using a diode which is already present.

It could have been devised to add a waveguide optically coupled to the resonant ring to deviate a portion of the light signal propagating therein to observe it with a photodiode and thus determine the value of the resonance wavelength of the ring. However, in an integrated device with a resonant ring, and in particular when the device includes a plurality of resonant rings, the provision of a waveguide and of a photodiode for each resonant ring causes an increase in the surface area and in the complexity of the device. Further, such a solution causes a decrease in the optical power of the output signals of the device due to the fact that a portion of the optical power is deviated outside of each resonant ring, for observation purposes only.

Figure 3:
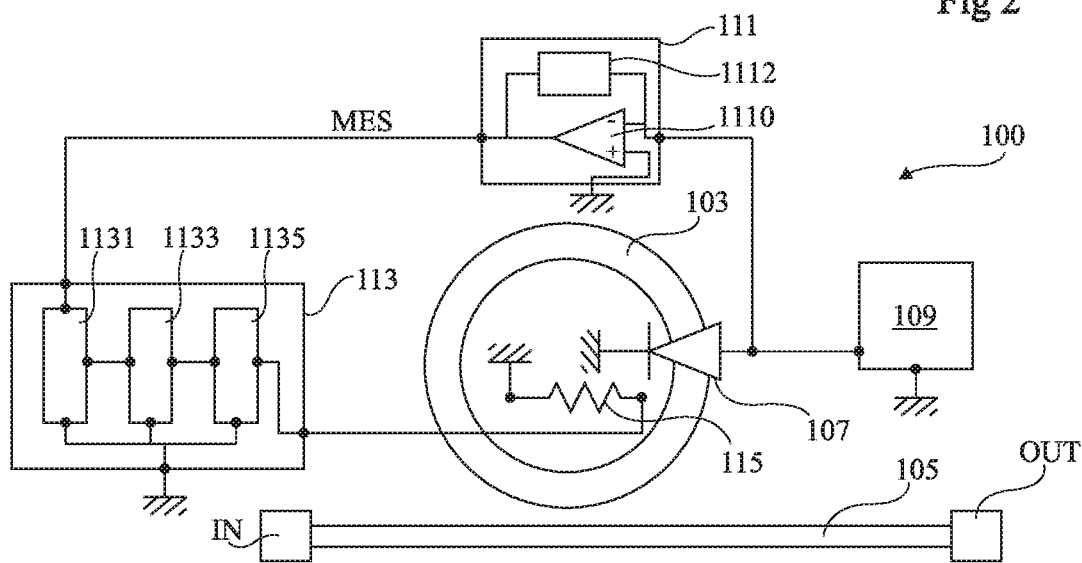
FIG. 3 is a top view illustrating in further detail an embodiment of the device of FIG. 1.

FIG. 3 is a simplified top view illustrating in further detail an embodiment of modulator 100.

The bias voltage of diode 107 is here available between an output terminal of circuit 109 and a node of application of a reference potential, typically the ground. A terminal of diode 107, for example, its anode, is electrically coupled, preferably electrically connected, to the output terminal of circuit 109. The other terminal of diode 107, here its cathode, is electrically coupled, preferably electrically connected, to the node of application of the reference potential. Thus, when the diode is reverse-biased, circuit 109 supplies the anode of diode 107 with a potential such that the voltage between the anode and the cathode of diode 107 is smaller than the threshold voltage of the diode, preferably negative.

In this example, circuit 111 includes an operational amplifier 1110 assembled as a transimpedance amplifier. A first input terminal of amplifier 1110, for example, the inverting input (−), is electrically coupled, preferably electrically connected, to the input terminal of circuit 111 which is electrically coupled, preferably electrically connected, to a terminal of diode 107, here, the anode. A second terminal of amplifier 1110, for example, the non-inverting input (+), is for example electrically coupled, preferably electrically connected, to a node of application of the reference potential. The output terminal of amplifier 1110 is electrically coupled, preferably electrically connected, to the output terminal of circuit 111 and supplies signal MES, for example, in the form of a potential referenced to the reference potential. A feedback loop 1112, here schematically shown as a block, electrically couples the output terminal of amplifier 1110 to its inverting input terminal. As an example, feedback loop 1112 is a resistor having a terminal electrically connected to the inverting input terminal of amplifier 1110, and having its other terminal electrically connected to the output terminal of amplifier 1110, feedback loop 1112 including a capacitor in parallel with the resistor.

An input terminal of control circuit 113 is electrically coupled, preferably electrically connected, to the output terminal of measurement circuit 111 to receive signal MES. Control signal 113 here includes an analog-to-digital converter 1131 having an input terminal electrically coupled, preferably electrically connected, to the input terminal of circuit 113, and having an output terminal supplying a digital signal corresponding to signal MES. Control circuit 113 further includes a processing unit 1133, for example, a microprocessor or a microcontroller, having an input terminal electrically coupled, preferably electrically connected, to the output terminal of converter 1131 to receive the digital signal corresponding to signal MES. Processing unit 1133 is configured to implement the functions of circuit 113 previously described in relation with FIGS. 1 and 2. An output terminal of processing unit 1133 supplies a digital control signal. Control circuit 113 also includes a digital-to-analog converter 1135 having an input terminal electrically coupled, preferably electrically connected, to the output terminal of processing unit 1133 to receive the digital control signal, and having an output terminal supplying a corresponding analog control signal. The output terminal of converter 1135 is electrically coupled, preferably electrically connected, to an output terminal of circuit 113, the latter being electrically coupled, preferably electrically connected, to a terminal of heating element 115. In this example, the signal controlling heating element 115 is a voltage available between the output terminal of control circuit 113 and a node of application of the reference potential. The other terminal of heating element 115 is then electrically coupled, preferably electrically connected, to the node of application of the reference potential.

Although this is shown neither in FIG. 3, nor in FIG. 1, control circuit 113 may include an additional output terminal electrically coupled, preferably electrically connected, to an additional input terminal of bias circuit 109 to supply a control signal to circuit 109, the value of this control signal for example determining the value of the bias voltage that circuit 109 applies to diode 107.

Figure 4:
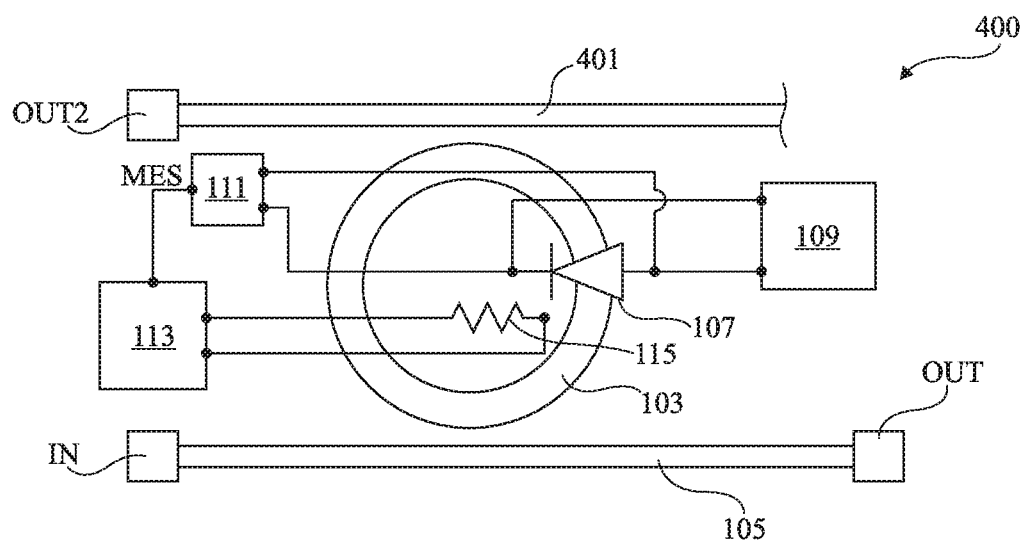
FIG. 4 is a top view very schematically illustrating an embodiment of another integrated electro-optical device with a resonant ring.

FIG. 4 is a top view very schematically showing an embodiment of an integrated electro-optical switch 400 with a resonant ring.

Switch 400 includes the same elements as modulator 100 of FIG. 1, designated with the same reference numerals. Switch 400 further includes a waveguide 401, for example, rectilinear. A portion of waveguide 401 is arranged sufficiently close to, for example, in contact with a portion of waveguide 103 so that an optical coupling can be established between these portions. Thus, when a signal propagates through ring waveguide 103, this signal may flow through waveguide 401 by optical coupling and propagate therethrough to an output OUT2 of switch 400.

In operation, a light signal is supplied to input IN of the switch and a corresponding light signal is available at the level of each of outputs OUT and OUT2 of switch 400.

The expected operation of switch 400 is the following. When diode 107 is not biased, resonant ring 103 has a resonance wavelength of targeted value λ1. For the wavelength of value λ1, the optical coupling between waveguide 103 and waveguides 105 and 401 is significant and the signal supplied to input IN essentially flows through ring waveguide 103, and then through waveguide 401, where it propagates to output OUT2. As a result, at this wavelength of value λ1, the optical power transmitted from input IN to output OUT2 is relatively high, the optical power transmitted from input IN to output OUT then being relatively low.

When diode 107 is biased, reverse-biased if it is of PN type and forward-biased if it is of PiN type, the resonance wavelength of waveguide 103 has a targeted value λ2 depending on the value of the bias voltage. A the wavelength of value λ1, the optical coupling between waveguide 103 and waveguides 105 and 401 is lighter than in the absence of a biasing of diode 107 and the signal supplied to input IN is essentially propagated to output OUT of the modulator. As a result, at this wavelength of value λ1, the optical power transmitted from input IN to output OUT is relatively high, the optical power transmitted from input IN to output OUT2 then being relatively low.

Thus, at the wavelength of value λ1, according to whether diode 107 is biased or not, the signal supplied to input IN is essentially transmitted to one or the other of outputs OUT and OUT2 of switch 400.

In real operation, like for modulator 100, an offset Δλ of the resonance wavelength of ring 103 with respect to a targeted value can be observed. As for modulator 100, a measurement of the resonance wavelength of ring 103 of switch 400 is performed by locating the maximum value of the leakage current in reverse biased diode 107. A step of correcting the resonance wavelength of ring 103 can then be implemented by determining, based on the measured value of the resonance wavelength, the value of the signal controlling heating element 115.

The more detailed embodiment of modulator 100 described in relation with FIG. 3 applies to switch 400.

Figure 5A:
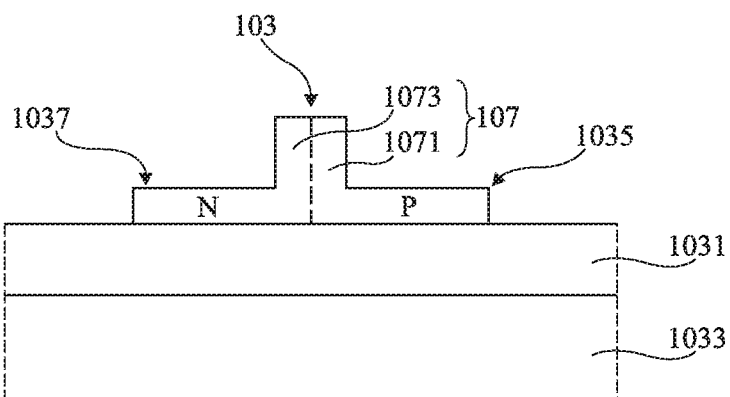
FIGS. 5A and 5B are cross-section views, each illustrating in more detailed fashion embodiments of the resonant ring of the devices of FIGS. 1, 3, and 4.
Figure 5B:
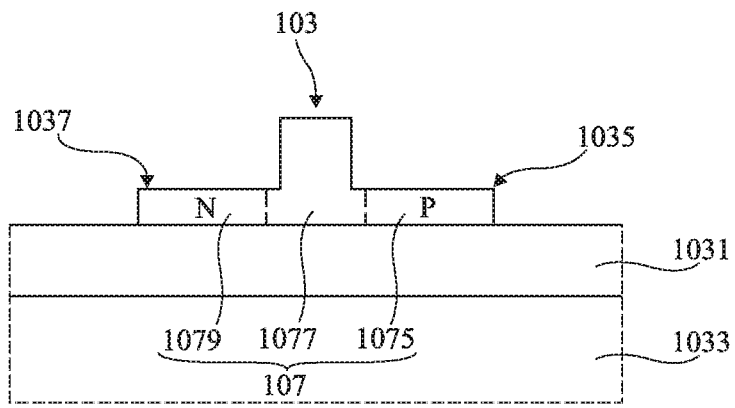

FIGS. 5A and 5B illustrate an embodiment of waveguide 103 of devices 100 and 400, these drawings being cross-section views of a portion of waveguide 103 having the junction of diode 107 extending therein in the case where the diode is respectively of PN type and of PiN type. More particularly, the cross-section plane corresponding to the views of FIGS. 5A and 5B is a plane orthogonal to the propagation direction of a signal in waveguide 103, that is, a plane orthogonal to the longitudinal direction of waveguide 103. In this embodiment, waveguide 103 has a rectangular transverse cross-section.

Ring waveguide 103 rests on top of, and is in contact with, an insulating layer 1031, for example, made of silicon oxide, itself resting on a support 1033, for example, a silicon substrate. Waveguide 103 is bordered by strips 1035 and 1037, preferably made of the same material as waveguide 103, for example, silicon, the strips extending laterally from waveguide 103. In this example, strips 1035 and 1037 rest on layer 1031. Strip 1035 extends laterally from a first side of waveguide 103 (on the right-hand side in the drawings), strip 1037 extending laterally from a second side of waveguide 103 opposite to the first one (on the left-hand side in these drawings). In a direction orthogonal to the upper surface of layer 1031, the thickness or height of strip 1035 is for example substantially equal, preferably equal, to the height of strip 1037. The height of strips 1035 and 1037 is smaller than that of waveguide 103. An insulating layer, not shown, for example, made of the same material as insulating layer 1031, covers waveguide 103 and strips 1035 and 1037. In practice, waveguide 103 and strips 1035 and 1037 which border it may be formed from a SOH ("Semiconductor On Insulator") semiconductor layer resting on insulating layer 1031, for example, by etching the SOI layer to define waveguide 103 and strips 1035 and 1037 therein.

In FIG. 5A, diode 107 includes a doped semiconductor region 1071 of a first conductivity type, for example, of type P, and a doped semiconductor region 1073 of the second conductivity type opposite to the first one, for example, of type N. Each of regions 1071 and 1073 extends in waveguide 103 so that the junction of diode 107 extends in waveguide 103. Each of regions 1071 and 1073 continues in the strip 1035 or 1037 with which it is in contact. Strips 1035 and 1037 thus form contacting areas respectively for the anode and the cathode of diode 107.

In this example, the junction of diode 107, shown in dotted lines in FIG. 5A, extends upwards from layer 1031 along the entire height of waveguide 103, preferably in a direction substantially orthogonal to the upper surface of layer 1031. In waveguide 103, region 1071 for example has a width substantially equal, preferably equal, to the width of region 1073, the width of regions 1071, 1073 being measured in a plane parallel to the upper surface of layer 1031.

In FIG. 5B, diode 107 includes a doped semiconductor region 1075 of a first conductivity type, for example, type P, a doped semiconductor region 1079 of the second conductivity type opposite to the first one, for example, type N, and an intrinsic semiconductor region 1077 extending between regions 1075 and 1079. Region 1077, in other words, the junction of diode 107, extends in waveguide 103, for example, across the entire width and along the entire height of waveguide 103. In the example of FIG. 5B, region 1077 continues in a portion of each of strips 1035 and 1037. Regions 1075 and 1079 extend in respective strips 1035 and 1037, from region 1077. Strips 1035 and 1037 thus form contacting areas, respectively for the anode and the cathode.

Although this is not shown in FIGS. 5A and 5B, it is preferably provided for the junction of diode 107 to extend lengthwise in as long a longitudinal portion (or section) of waveguide 103 as possible to increase the accuracy of the leakage current measurement in diode 107. It is preferably provided for this junction not to extend in the portion(s) of waveguide 103 at the level of which optical couplings are performed with other waveguides, for example, with waveguide 105 or 401, these portions being then non-doped. Along the portions of waveguide 103 at the level of which optical couplings with other waveguides are performed, strips 1035 and 1037 may be non-doped or may be omitted.

As an example, waveguide 103 and strips 1035 and 1037 are made of silicon and have the following dimensions:
  width of waveguide 103 in the range from 200 to 500 nm, for example, approximately equal to 320 nm, preferably equal to 320 nm;
  height of waveguide 103 from insulating layer 1031 in the range from 200 to 500 nm, for example, approximately equal to 360 nm, preferably equal to 360 nm;
  width of each of strips 1035 and 1037 from waveguide 103 in the range from 0.75 to 1.5 μm, for example, approximately equal to 1.1 μm, preferably equal to 1.1 μm; and
  height of strips 1035 and 1037 in the range from 25 to 75 nm, for example approximately equal to 50 nm, preferably, equal to 50 nm.

Such a waveguide 103 is configured to transmit signals having wavelengths in the near infrared range, for example, in the range from approximately 1 μm to approximately 2 μm, preferably in the range from 1 to 2 μm.

Specific embodiments have been described. Various alterations, modifications, and improvements will occur to those skilled in the art. In particularly, although only two resonant ring devices have been described, the above-described embodiments apply to other resonant ring devices, particularly to more complex devices including a plurality of resonant rings, for example, to the devices of article "Loss-Aware Switch Design and Non-Blocking Detection Algorithm for Intra-Chip Scale Photonic Interconnection Networks" of H. Shabani et al. (IEEE Transactions on Computers, 2016).

Further, although a waveguide 105 which is coupled to a single resonant ring has been described, the described embodiments apply to the case where waveguide 105 is optically coupled to a plurality of successive resonant rings, each ring having a different resonance wavelength and being associated with a circuit for measuring its resonance wavelength and with a control circuit, where the latter may be common to a plurality of rings. Such a device is for example provided in a transmit circuit to modulate a plurality of wavelengths of a signal to be transmitted so that each modulated wavelength enables to transmit a corresponding data flow. Such a device may also be used as an optical demultiplexer in a circuit for receiving a signal, a plurality of its wavelengths having been modulated, the rings then enabling to extract a signal for each modulated wavelength to then be able to recover a data flow transmitted via this wavelength.

Further, although circuits 109, 111, and 113 have been described as separate elements, the functionalities of circuits 109, 111, and 113 may be implemented by a single circuit. Conversely, although a control circuit including three sub circuits 1131, 1133, and 1135 has been described, it is possible for some of these sub-circuits not to be included in circuit 113. For example, converter 1131 may be provided in measurement circuit 111.

Other geometries of diodes than those described may be provided, provided for the junction of the PN- or PiN-type diode to be at least partly in the waveguide and, more particularly, for the space charge area of the junction to be crossed by a light signal propagating through the waveguide. For example, a diode having its junction extending substantially parallel to the upper surface of layer 1031 rather than orthogonally to this surface as described in relation with FIGS. 5A and 5B may be provided. A segmented PN-type diode, that is, a diode including an alternated succession of doped semiconductor areas of a first conductivity type and of doped semiconductor areas of the second conductivity type, may also be provided. A PiN-type diode including an additional P-type doped semiconductor area separating the intrinsic area into two portions may also be provided. More generally, it is sufficient for the diode to enable to modify the resonance frequency of the ring when the diode biasing is modified, and for the leakage current of the reverse-biased diode to be proportional to the power of the light signal flowing through the diode.

The correction of the resonance wavelength of the ring may be performed with other components than a heating element, for example, with an additional PN- or PiN-type diode.

Such alterations, modifications, and improvements are intended to be part of this disclosure, and are intended to be within the spirit and the scope of the present invention. Accordingly, the foregoing description is by way of example only and is not intended to be limiting.

What is claimed is:

1. A device comprising:
 a ring waveguide;
 a diode comprising a junction extending at least partly in the ring waveguide;
 a measurement circuit coupled to the diode, the measurement circuit configured to generate a signal representative of a leakage current in the diode; and
 a control circuit coupled to the measurement circuit, the control circuit comprising:
  a memory element storage comprising instructions and a resonance wavelength target value; and
  a processor in communication with the memory element storage, wherein the processor executes the instructions to:
   determine a maximum value of the leakage current from the signal representative of the leakage current in the diode,
   determine a value of a resonance wavelength of the ring waveguide based on the maximum value of the leakage current; and
   calculate a difference between the determined value of the resonance wavelength of the ring waveguide and the resonance wavelength target value and, based thereon, modify a temperature of the ring waveguide.

2. The device of claim 1, wherein the junction of the diode and the ring waveguide are concentric.

3. The device of claim 1, wherein the diode is a PN-type diode.

4. The device of claim 1, wherein the diode is a PiN-type diode having a junction corresponding to an intrinsic region of the diode.

5. The device of claim 1, wherein the junction of the diode fully extends into the ring waveguide.

6. The device of claim 1, further comprising a heating element coupled to the control circuit.

7. The device of claim 6, wherein the heating element is controlled according to the signal representative of the leakage current.

8. The device of claim 6, wherein modifying the temperature of the ring waveguide comprises supplying,
 to the heating element, a control signal determined by the calculated difference.

9. The device of claim 1, further comprising at least another waveguide optically coupled to the ring waveguide.

10. The device of claim 1, wherein a width of the ring waveguide is in a range from 200 nm to 500 nm.

11. The device of claim 1, further comprising an insulating layer, and wherein the ring waveguide rests on top of and is in contact with the insulating layer.

12. The device of claim 11, wherein a height of the ring waveguide from the insulating layer is in a range from 200 to 500 nm.

13. The device of claim 1, wherein the ring waveguide is configured to transmit signals having wavelengths in a range from approximately 1 µm to approximately 2 µm.

14. The device of claim 1, wherein the signal representative of the leakage current in the diode takes a plurality of values, each of which is representative of the leakage current in the diode for a given wavelength of the signal supplied to an input of the ring waveguide.

15. A device comprising:
 a ring waveguide;
 a diode comprising a p/n junction, the p/n junction comprising a region disposed in the ring waveguide;
 a transimpedance amplifier coupled to the diode; and
 a processing circuit comprising:
  a memory element storage comprising instructions; and
  a microprocessor in communication with the memory element storage, wherein the microprocessor executes the instructions to
   receive an output from the transimpedance amplifier,
   determine a value of a resonance wavelength of the ring waveguide by determining a wavelength corresponding to a maximum value of the output from the transimpedance amplifier, and calculate a difference between the determined value of the resonance wavelength of the ring waveguide and a resonance wavelength target value and, based thereon, modify a temperature of the ring waveguide.

16. The device of claim 15, wherein the device further comprises a heating element coupled to the output of the processing circuit, wherein the microprocessor executes the instructions to output a control signal to the heating element based on the calculated difference.

17. The device of claim 16, wherein the heating element comprises a resistor arranged proximate a portion of the ring waveguide, wherein the microprocessor is coupled between an analog-to-digital converter and a digital-to-analog converter.

18. A device comprising:
a ring waveguide;
a heater configured to heat the ring waveguide;
a diode comprising a p/n junction, the p/n junction comprising a region disposed in the ring waveguide;
an operational amplifier coupled to the diode, the operational amplifier configured to supply a signal representative of a leakage current in the diode; and
a processing circuit comprising:
   a memory element storage comprising instructions; and
   a microcontroller in communication with the memory element storage, wherein the microcontroller executes the instructions to
      receive the signal from the operational amplifier,
      determine a value of a resonance wavelength of the ring waveguide by determining a wavelength corresponding to a maximum value of the leakage current, and
      calculate a difference between the determined value of the resonance wavelength of the ring waveguide and a resonance wavelength target value and, based thereon, modify a temperature of the ring waveguide.

19. The device of claim 18, wherein the heater is controlled according to the signal representative of the leakage current.

20. The device of claim 18, wherein the microcontroller executes the instructions to
provide, to the heater, a control signal determined by the calculated difference.

* * * * *

UNITED STATES PATENT AND TRADEMARK OFFICE
CERTIFICATE OF CORRECTION

PATENT NO. : 10,871,663 B2  
APPLICATION NO. : 16/401956  
DATED : December 22, 2020  
INVENTOR(S) : Le Maitre et al.

Page 1 of 1

It is certified that error appears in the above-identified patent and that said Letters Patent is hereby corrected as shown below:

On the Title Page

Item (73) Assignees, Line 4, delete "ETAUX" and insert --ET AUX--.

Signed and Sealed this  
Thirtieth Day of March, 2021

Drew Hirshfeld  
*Performing the Functions and Duties of the*  
*Under Secretary of Commerce for Intellectual Property and*  
*Director of the United States Patent and Trademark Office*